United States Patent
Lu et al.

(10) Patent No.: US 9,373,536 B2
(45) Date of Patent: Jun. 21, 2016

(54) STRESS REDUCTION APPARATUS

(71) Applicant: Taiwan Semiconductor Manufacturing Company, Ltd., Hsin-Chi (TW)

(72) Inventors: Ying-Ti Lu, Tainan (TW); Wen-Tsao Chen, Tainan (TW); Ming-Ray Mao, Tainan (TW); Kuan-Chi Tsai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 125 days.

(21) Appl. No.: 14/137,765

(22) Filed: Dec. 20, 2013

(65) Prior Publication Data

US 2014/0106563 A1 Apr. 17, 2014

Related U.S. Application Data (62) Division of application No. 13/370,161, filed on Feb. 9, 2012, now Pat. No. 8,629,559.

(51) Int. Cl.
| | |
|---|---|
| *H01L 21/4763* | (2006.01) |
| *H01L 21/768* | (2006.01) |
| *H01L 23/522* | (2006.01) |

(52) U.S. Cl.
CPC .... *H01L 21/76802* (2013.01); *H01L 21/76804* (2013.01); *H01L 21/76834* (2013.01); *H01L 21/76843* (2013.01); *H01L 21/76877* (2013.01); *H01L 23/5227* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,774,200 A | | 9/1988 | Nakajima et al. |
| 5,852,328 A | * | 12/1998 | Nishimura ........ H01L 21/76804 257/740 |
| 6,294,457 B1 | * | 9/2001 | Liu ............................. 438/623 |
| 6,407,002 B1 | * | 6/2002 | Lin ................... H01L 21/31144 257/E21.256 |
| 7,564,081 B2 | | 7/2009 | Zhu et al. |
| 7,934,712 B2 | | 5/2011 | Boss |
| 2003/0089988 A1 | | 5/2003 | Matsuura |
| 2004/0121621 A1 | * | 6/2004 | Ruelke et al. ................. 438/786 |
| 2004/0155340 A1 | * | 8/2004 | Owada et al. ................. 257/751 |
| 2006/0003577 A1 | * | 1/2006 | Sone ............................. 438/638 |
| 2007/0045606 A1 | | 3/2007 | Magistretti et al. |
| 2008/0258262 A1 | | 10/2008 | Nagai |
| 2009/0046498 A1 | | 2/2009 | Philipp et al. |
| 2011/0193059 A1 | | 8/2011 | Wierer et al. |

FOREIGN PATENT DOCUMENTS

| | | |
|---|---|---|
| CN | 101740473 A | 6/2010 |
| EP | 1119035 A2 | 7/2001 |

* cited by examiner

*Primary Examiner* — Evan Pert
*Assistant Examiner* — Shaka White
(74) *Attorney, Agent, or Firm* — Slater Matsil, LLP (57) ABSTRACT

A stress reduction apparatus comprises a metal structure formed over a substrate, an inter metal dielectric layer formed over the substrate, wherein a lower portion of the metal structure is embedded in the inter metal dielectric layer and an inverted cup shaped stress reduction layer formed over the metal structure, wherein an upper portion of the metal structure is embedded in the inverted cup shaped stress reduction layer.

19 Claims, 6 Drawing Sheets

STRESS REDUCTION APPARATUS

This application is a divisional of U.S. patent application Ser. No. 13/370,161, entitled "Stress Reduction Apparatus," filed on Feb. 9, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for integrating an inductor in a semiconductor die. The inductor can be formed on the surface of a semiconductor device substrate in a spiral shape created in a plane that is parallel to the substrate surface.

As semiconductor technologies evolve, the inductor embedded in a semiconductor device can be formed of copper by using an ultra-thick metal (UTM) process. Copper inductors have emerged as an effective alternative to further reduce power losses of a semiconductor chip. In a copper inductor, the copper structure of the inductor can be formed by using damascene processes. In this technology, a dielectric layer is patterned to form a trench. After the patterning, a barrier layer may be deposited on the trench. A seed layer may be deposited on the barrier layer to provide better adhesion of copper. Furthermore, through an electrochemical plating process, metal materials such as copper fill the trench to form metal structures such as metal lines and vias.

Damascene processes can be divided into categories, namely single damascene processes and dual damascene processes. In single damascene technology, a metal via and its adjacent metal line may have different process steps. As a result, each may require a chemical mechanical planarization process to clean the surface. In contrast, in dual damascene technology, a metal via and its adjacent metal line may be formed within a single trench. As a result, two dielectric patterning processes and one CMP process are required in a dual damascene process to form the metal via and its adjacent metal line.

In a copper inductor, the copper structure of the inductor may be enclosed by a dielectric layer. There may be a concentration of stress in the areas adjacent to the interface between a corner of the copper structure and its adjacent dielectric layer. As a result, dielectric cracks may occur in the area adjacent to the copper structure. Such dielectric cracks may lead to an unreliable semiconductor device.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a stress reduction apparatus. The disclosure may also be applied, however, to a variety of semiconductor devices.

Figure 1:
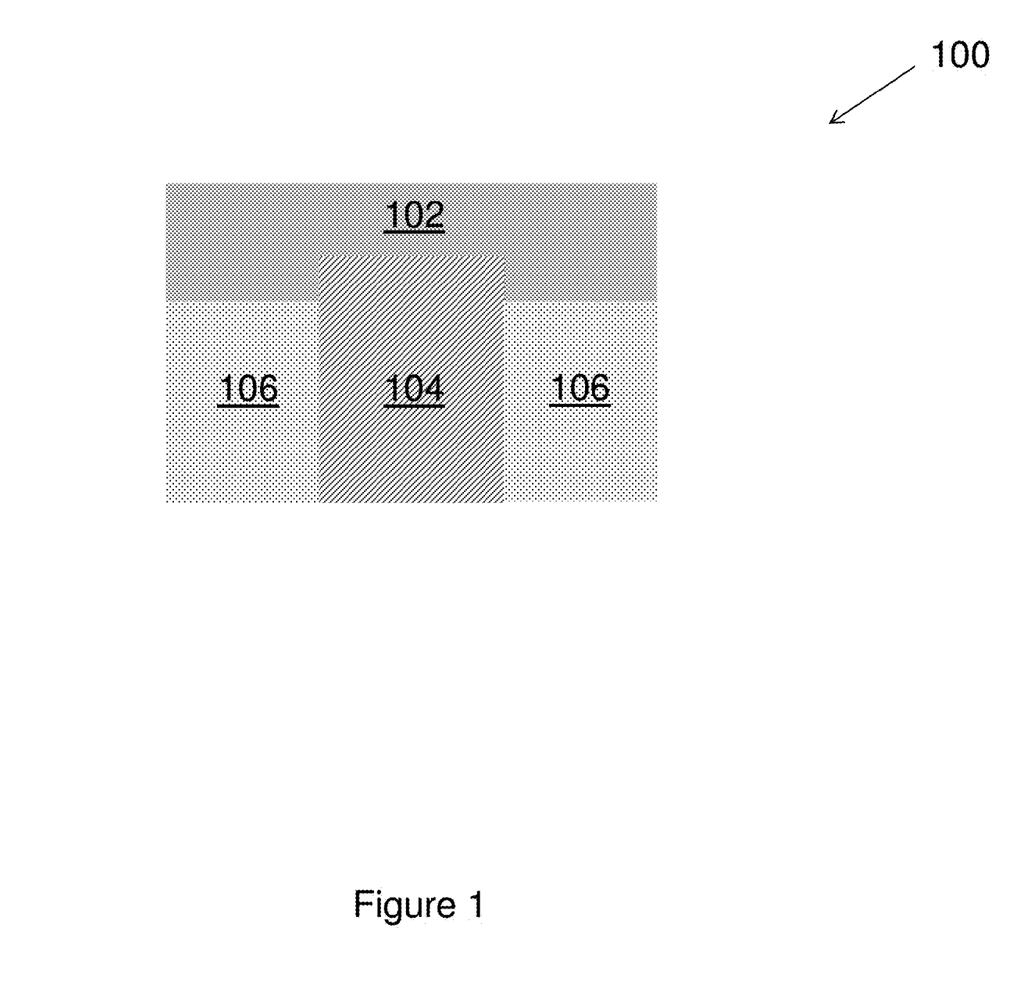
FIG. 1 illustrates a cross sectional view of a stress reduction apparatus in accordance with an embodiment.

FIG. 1 illustrates a cross sectional view of a stress reduction apparatus in accordance with an embodiment. For simplicity, only relevant portions of a semiconductor device are illustrated. The detailed cross sectional view of a semiconductor device having a stress reduction apparatus will be discussed below with respect to FIG. 2. The stress reduction apparatus 100 comprises an inverted cup shaped layer 102, a metal structure 104, an inter-metal dielectric (IMD) layer 106. In accordance with an embodiment, the IMD layer 106 may be formed of dielectric materials such as oxide and the like. The inverted cup shaped layer 102 may be formed of silicon nitride and the like. The metal structure 104 may be formed of copper and the like. In accordance with an embodiment, the metal structure 104 may be formed by using an ultra-thick metal (UTM) process. In particular, the metal structure 104 may be a portion of an embedded inductor formed by the UTM process.

As shown in FIG. 1, the inverted cup shaped layer 102 functions as a cap covering the upper terminal of the metal structure 104. More particularly, the upper left corner and the upper right corner of the metal structure 104 are protected by the inverted cup shaped layer 102. One advantageous feature of having the inverted cup shaped layer 102 is that the dielectric material surrounding the upper corners helps to reduce stress so as to prevent the metal structure 104 and the IMD layer 106 from cracking.

Figure 2:
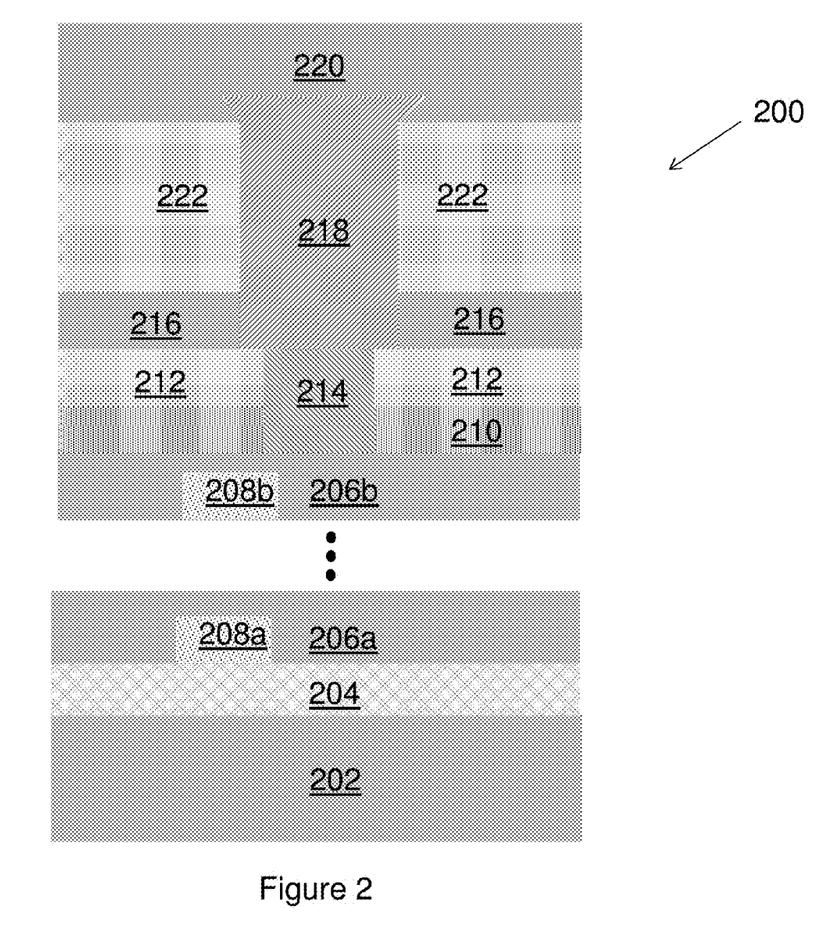
FIG. 2 illustrates a cross sectional view of a semiconductor device having the stress reduction apparatus shown in FIG. 1.

FIG. 2 illustrates a cross sectional view of a semiconductor device having the stress reduction apparatus shown in FIG. 1. As shown in FIG. 2, the stress reduction apparatus is formed on a semiconductor die 200. The semiconductor die 200 comprises a substrate 202. The substrate 202 may be a silicon substrate. Alternatively, the substrate 202 may be a silicon-on-insulator substrate. The substrate 202 may further comprise a variety of electrical circuits (not shown). The electrical circuits formed on the substrate 202 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 204 is formed on top of the substrate 202. The interlayer dielectric layer 204 may be formed, for example, of a low-K dielectric material, such as silicon oxide. The interlayer dielectric layer 204 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 204 may further comprise a plurality of dielectric layers.

A bottom metallization layer 206a is formed over the interlayer dielectric layer 204. As shown in FIG. 2, the bottom metallization layer 206a may comprise a metal line 208a. The metal line 208a is formed of metal materials such as copper, copper alloys, aluminum, silver, gold and any combinations thereof. The metallization layers 206a and 206b may be formed through any suitable techniques (e.g., deposition, damascene and the like). Generally, the one or more inter-metal dielectric layers and the associated metallization layers are used to interconnect the electrical circuits in the substrate 202 to each other to form functional circuitry and to further provide an external electrical connection.

A top metallization layer 206b is formed over the bottom metallization layer 206a. As shown in FIG. 2, a top metal line 208b is embedded in the top metallization layer 206b. In particular, the top metal line 208b provides a conductive channel for the electrical circuits of the semiconductor device 200. The top metal line 208b may be made of metallic materials such as copper, copper alloys, aluminum, silver, gold and any combinations thereof. The top metal line 208b may be formed by suitable techniques such as CVD. Alternatively, the top metal connector 124 may be formed by sputtering, electroplating and the like.

It should be noted while FIG. 2 shows the bottom metallization layer 206a and the top metallization layer 206b, one skilled in the art will recognize that one or more inter-metal dielectric layers (not shown) and the associated metallization layers (not shown) are formed between the bottom metallization layer 206a and the top metallization layer 206b. In particular, the layers formed over the bottom metallization layer 206a and the top metallization layer 206b may be formed by alternating layers of dielectric (e.g., extremely low-k dielectric material) and conductive materials (e.g., copper).

The layers above the top metallization layer 206b may be formed by different fabrication process such as ultra-thick metal (UTM) technology. As shown in FIG. 2, the metal structures maybe substantially thicker and wider than those in the metallization layers. More detail is provided below.

A first etch stop layer (ESL) 210 is formed over the substrate 202. The first ESL layer 210 may be formed of a dielectric material having a different etch selectivity from adjacent layers. In accordance with an embodiment, the first ESL layer 210 is formed of non-organic materials such as silicon nitride, silicon carbon nitride and the like. The first ESL layer 210 may be formed through any suitable techniques such as CVD or PECVD techniques. The first ESL layer 210 is employed to prevent the etchant from damaging the layers (e.g., the top metallization layer 206b) beneath the first ESL layer 210.

A first inter-metal dielectric layer (IMD) 212 is formed on the top metallization layer 206b. The first IMD layer 212 may be formed of dielectric materials such as oxide and the like. The first IMD layer 212 may be formed by using PECVD techniques or high-density plasma chemical vapor deposition (HDPCVD) or the like A second ESL layer 216 is formed on top of the first IMD layer 212. The second ESL layer 216 may be similar to the first ESL layer 210, and hence is not discussed in further detail to avoid unnecessary repetition. As shown in FIG. 2, a metal via 214 is formed in the openings of the first IMD layer 212 and the first ESL layer 210. In accordance with an embodiment, the metal via 214 may be formed of copper. For simplicity, throughout the description, the metal via 214 may be alternatively referred to as a copper via 214.

A metal structure 218 is formed on top of the copper via 214. In accordance with an embodiment, the metal structure 218 may be formed of copper. For simplicity, throughout the description, the metal structure 218 may be alternatively referred to as a copper structure 218. The copper structure 218 may be enclosed by a second ESL layer 216, a second IMD layer 222 and an inverted cup shaped layer 220. In particular, a lower portion of the copper structure 218 is embedded in the second IMD layer 222 and a top portion of the copper structure 218 is embedded in the inverted cup shaped layer 220. Furthermore, the inverted cup shaped layer 220 covers the upper terminal of the copper structure 218. The inverted cup shaped layer 222 is formed of non-organic materials such as silicon nitride, silicon carbon nitride and the like. The detailed formation of the inverted cup shaped layer 220 will be described below with respect to FIG. 3 to FIG. 6.

FIGS. 3-6 illustrate intermediate stages of a single damascene process of forming the copper structure 218 in accordance with an embodiment. However, as one having ordinary skill in the art will recognize, the copper formation process described below is merely an exemplary process and is not meant to limit the current embodiments. Other copper formation processes such as dual damascene processes may alternatively be used. Furthermore, any suitable copper formation process may be used, and all such processes are fully intended to be included within the scope of the embodiments discussed.

Figure 3:
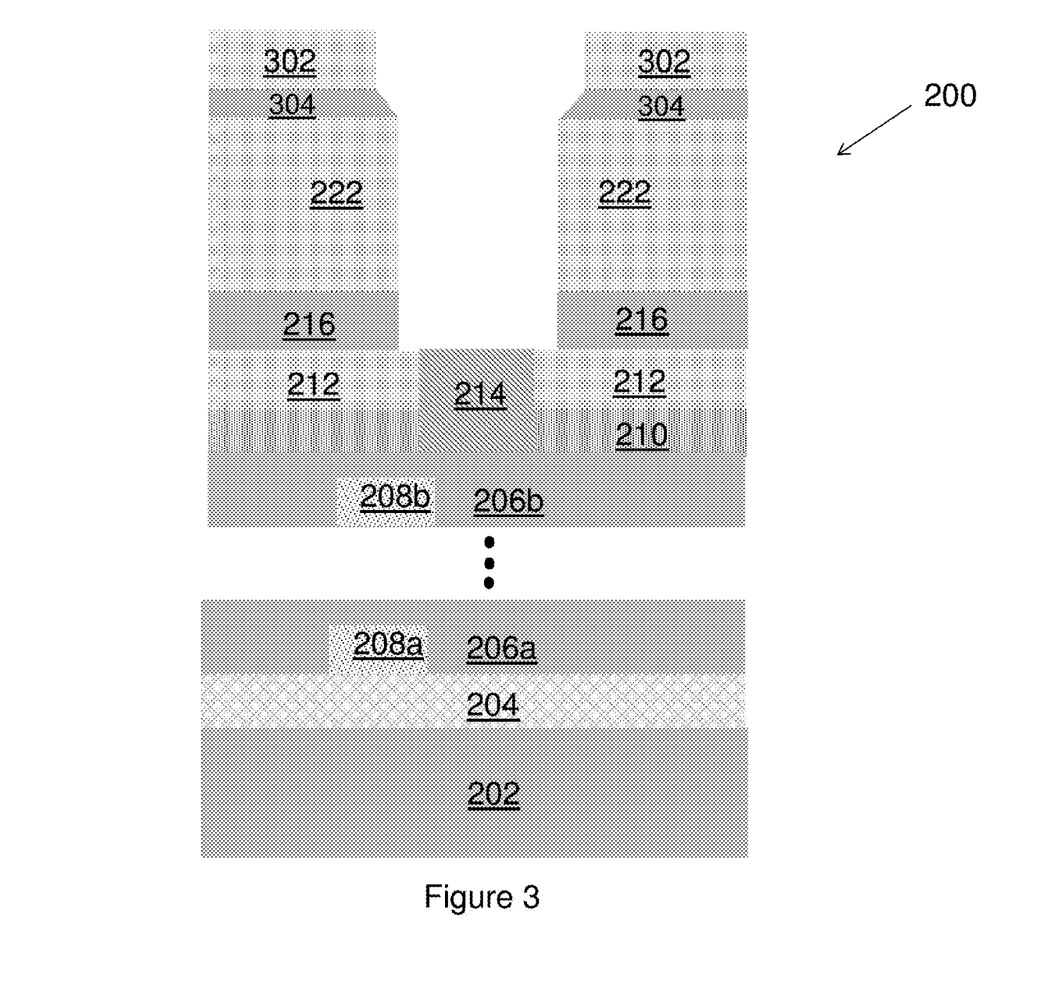
FIG. 3 illustrates a cross sectional view of a semiconductor device after trench patterning in accordance with an embodiment.

FIG. 3 illustrates a cross sectional view of a semiconductor device after trench patterning in accordance with an embodiment. The semiconductor device comprises a copper via 214. The formation method of the copper via 214 in a single damascene process is well known in the art, and hence is not discussed herein to avoid unnecessary repetition. In comparison with the layer structure shown in FIG. 2, the semiconductor device shown in FIG. 3 includes a stress reduction layer 304 and a third IMD Layer 302 formed on top of the stress reduction layer 304. In order to form the copper structure 218 shown in FIG. 2, a trench is formed by removing corresponding portions of the second ESL layer 216, the second IMD layer 222, the stress reduction layer 304 and the third IMD layer 302 as shown in FIG. 3. The trench shown in FIG. 3 can be formed by well-known etching techniques, which are not discussed herein to avoid unnecessary repetition.

Figure 4:
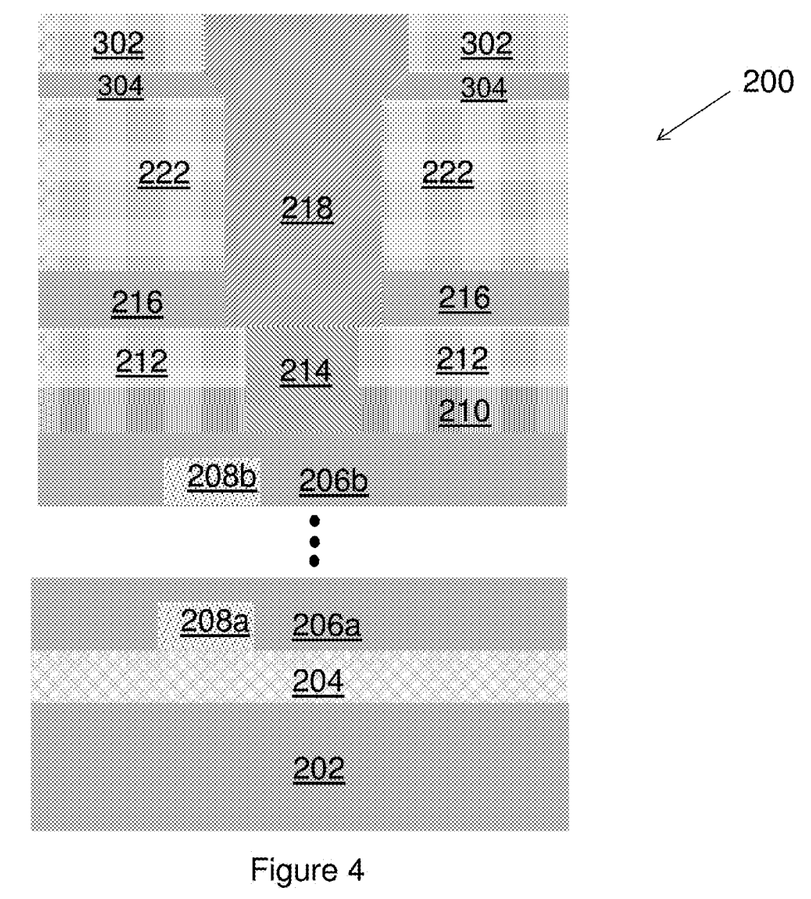
FIG. 4 illustrates a cross sectional view of a semiconductor device after an electrochemical plating process in accordance with an embodiment.

FIG. 4 illustrates a cross sectional view of a semiconductor device after an electrochemical plating process in accordance with an embodiment. As shown in FIG. 3, the second ESL layer 216, the second IMD layer 222, the stress reduction layer 304 and the third IMD layer 302 may be patterned to form an opening. After the patterning, a thin barrier layer (not shown) may be deposited on the opening. A copper seed layer (not shown) may be deposited on top of the thin barrier layer. The copper seed layer is employed to provide better adhesion of the copper on the underlying material. Furthermore, the copper seed layer may function as a catalytic material layer during the subsequent plating process. An electrochemical plating process may be employed to fill the opening so as to form the metal structure 218, which is electrically coupled to the copper via 214.

Figure 5:
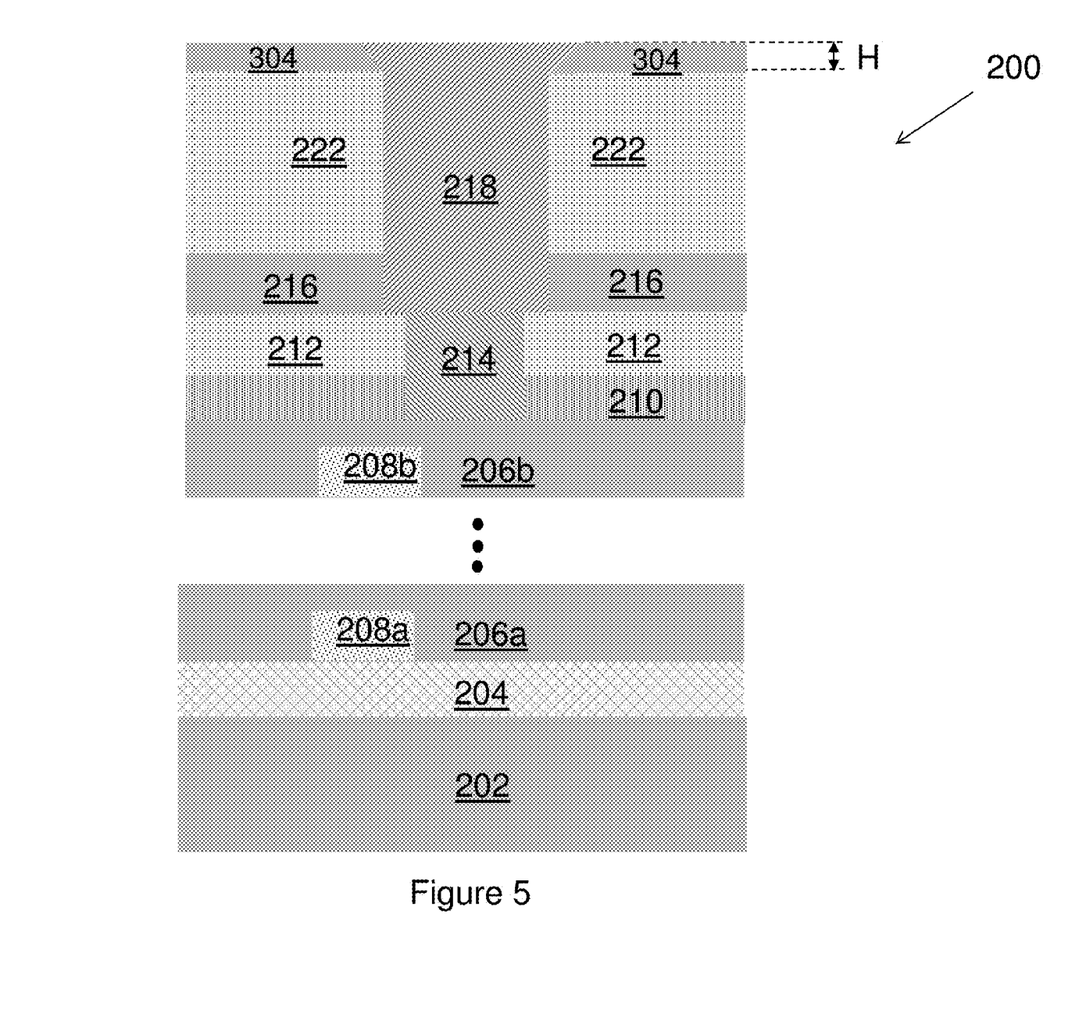
FIG. 5 illustrates a cross sectional view of a semiconductor device after a chemical mechanical planarization process in accordance with an embodiment.

FIG. 5 illustrates a cross sectional view of a semiconductor device after a chemical mechanical planarization (CMP) process in accordance with an embodiment. After the electrochemical plating process, a CMP process is employed to remove excess copper and polish the surface. As shown in FIG. 5, after the CMP process, the third IMD layer 302 (not shown but illustrated in FIG. 4) as well as a portion of the stress reduction layer 304 may be removed. The thickness of the stress reduction layer 304 after the CMP process is defined as H. In accordance with an embodiment, H is about 1000 A.

Figure 6:
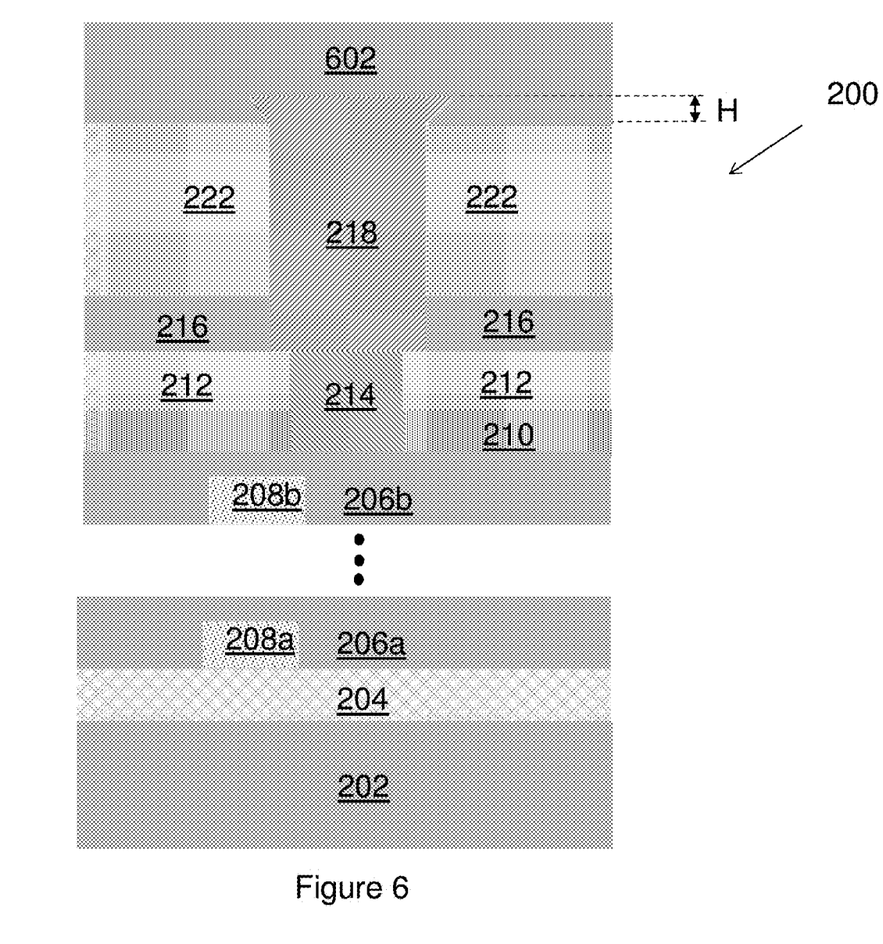
FIG. 6 illustrates a cross sectional view of a semiconductor device having an inverted cup shaped stress reduction layer in accordance with an embodiment.

FIG. 6 illustrates a cross sectional view of a semiconductor device having an inverted cup shaped stress reduction layer in accordance with an embodiment. After the CMP process, one more ESL layer 602 is formed on top of the copper surface as well as the stress reduction layer's surface. It should be noted that the ESL layer 602 may be formed of the same material (e.g., SiN) as the stress reduction layer 304 (shown in FIG. 5). As a result, the ESL layer 602 and the stress reduction layer 304 are combined into a single entity, which has an inverted cup shape as shown in FIG. 6. The inverted cup shaped layer shown in FIG. 6 helps to reduce the stress between the copper structure 218 and the IMD layer 222. In sum, an advantageous feature of having the inverted cup shaped layer 602 is that the upper corners of the copper structure 218 is covered by the inverted cup shaped layer 602. As a result, cracks in second IMD layer 222 are reduced.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a metal via over a substrate;
depositing a first inter metal dielectric layer over the substrate;
depositing a stress reduction layer over the first inter metal dielectric layer;
depositing a second inter metal dielectric layer over the stress reduction layer;
applying an etching process to the first inter metal dielectric layer, the stress reduction layer and the second inter metal dielectric layer and forming a trench over the metal via;
filling the trench with a conductive material to form a metal structure;
applying a chemical mechanical planarization process to the second inter metal dielectric layer and the stress reduction layer until the second inter metal dielectric layer is removed and the stress reduction layer is partially removed; and
forming an etch stop layer on the stress reduction layer and an upper terminal of the metal structure, wherein the upper terminal of the metal structure has a triangular corner region surrounded by the etch stop layer and the stress reduction layer.

2. The method of claim 1, further comprising:
applying the chemical mechanical planarization process to the stress reduction layer until the stress reduction layer is of a thickness of about 1000 Å.

3. The method of claim 2, wherein:
the stress reduction layer is formed of silicon nitride.

4. The method of claim 1, wherein:
the metal via is formed of copper.

5. The method of claim 1, wherein:
the conductive material is copper.

6. The method of claim 1, further comprising:
forming the metal via through a single damascene process.

7. A method comprising:
forming a metal via in a dielectric layer over a silicon substrate;
depositing a first etch stop layer over the dielectric layer;
depositing a first inter metal dielectric layer over the first etch stop layer;
depositing a stress reduction layer over the first inter metal dielectric layer;
forming a metal structure over the metal via, wherein the metal structure comprises:
a lower portion enclosed by the first etch stop layer;
a middle portion enclosed by the first inter metal dielectric layer; and
an upper portion enclosed by the stress reduction layer; and
depositing a second etch stop layer over the stress reduction layer, wherein the upper portion of the metal structure has a triangular corner region surrounded by the second etch stop layer and the stress reduction layer.

8. The method of claim 7, further comprising:
after the step of depositing the stress reduction layer over the first inter metal dielectric layer, depositing a second inter metal dielectric layer over the stress reduction layer.

9. The method of claim 8, further comprising:
forming a trench over the metal via through an etching process applied to the first inter metal dielectric layer, the stress reduction layer and the second inter metal dielectric layer; and
filling the trench through a plating process.

10. The method of claim 9, further comprising:
after the step of forming the trench over the metal via, forming a barrier layer over the trench; and
forming a seed layer over the barrier layer.

11. The method of claim 7, further comprising:
forming the metal structure a single damascene process; and
forming metal via is formed by using the single damascene process.

12. The method of claim 7, wherein:
the stress reduction layer has a thickness of about 1000 Å; and
the stress reduction layer is formed of silicon nitride.

13. The method of claim 7, wherein:
the second etch stop layer is formed of a same material as the stress reduction layer.

14. A method comprising:
forming a first inter metal dielectric layer over a substrate;
forming a stress reduction layer on the first inter metal dielectric layer;
forming a second inter metal dielectric layer on the stress reduction layer;
patterning the first inter metal dielectric layer, the stress reduction layer and the second inter metal dielectric layer to form an opening;
filling a metal material into the opening to form a metal structure;
applying a chemical mechanical planarization process to a surface of the second inter metal dielectric layer; and
forming an etch stop layer on the stress reduction layer and an upper terminal of the metal structure, wherein the upper terminal of the metal structure has a triangular corner region surrounded by the etch stop layer and the stress reduction layer.

15. The method of claim 14, further comprising:
filling the metal material into the opening by using an electrochemical plating process.

16. The method of claim 14, further comprising:
forming the etch stop layer using a same material as the stress reduction layer.

17. The method of claim 14, further comprising:
forming a metal via underneath the metal structure, wherein the metal via is electrically coupled to the metal structure.

18. The method of claim 17, further comprising:
forming the metal via using copper; and
forming the metal structure using copper.

19. The method of claim 18, further comprising:
forming the metal via using a single damascene process; and
forming the metal structure using the single damascene process.

* * * * *